United States Patent [19]
Loerzer et al.

[11] Patent Number: 6,037,102
[45] Date of Patent: Mar. 14, 2000

[54] MULTILAYER RECORDING ELEMENT SUITABLE FOR THE PRODUCTION OF FLEXOGRAPHIC PRINTING PLATES BY DIGITAL INFORMATION TRANSFER

[75] Inventors: Thomas Loerzer, Landau; Hartmut Sandig, Frankenthal; Friedrich Goffing, Limburgerhof; Alfred Leinenbach, Gönnheim; Hans-Jürgen Nisslmüller, Ludwigshafen, all of Germany

[73] Assignee: BASF Lacke + Farber Aktiengesellschaft, Muenster, Germany

[21] Appl. No.: 08/721,545

[22] Filed: Sep. 26, 1996

[30] Foreign Application Priority Data

Oct. 2, 1995 [DE] Germany ............... 195 36 805

[51] Int. Cl.⁷ ............... G03F 7/095; G03F 7/30; G03F 7/34
[52] U.S. Cl. ............... 430/306; 430/273.1; 430/944; 430/945
[58] Field of Search ............... 430/306, 273.1, 430/944

[56] References Cited

U.S. PATENT DOCUMENTS

| | | | |
|---|---|---|---|
| 4,020,762 | 5/1977 | Peterson | 101/467 |
| 4,555,471 | 11/1985 | Barzynski et al. | 430/273.1 |
| 5,015,553 | 5/1991 | Grandmont et al. | 430/260 |
| 5,262,275 | 11/1993 | Fan | 430/273.1 |
| 5,506,086 | 4/1996 | Van Zoeren | 430/306 |
| 5,654,125 | 8/1997 | Fan et al. | 430/306 |

FOREIGN PATENT DOCUMENTS

| | | |
|---|---|---|
| 1 138 | 3/1979 | European Pat. Off. . |
| 720 057 | 7/1996 | European Pat. Off. . |
| 741 330 | 11/1996 | European Pat. Off. . |
| 41 17 127 | 9/1981 | Germany . |
| 58052646 | 3/1983 | Japan . |
| 61036750 | 2/1986 | Japan . |
| WO92-02859 | 2/1992 | WIPO . |
| WO94/03839 | 8/1993 | WIPO . |
| 96/16356 | 5/1996 | WIPO . |

*Primary Examiner*—Cynthia Hamilton
*Attorney, Agent, or Firm*—Keil & Weinkauf

[57] ABSTRACT

A multilayer recording element is suitable for the production of flexographic printing plates by digital information transfer and has, arranged one on top of the other on a dimensionally stable substrate, a layer (A) crosslinkable by actinic radiation, a layer (B) sensitive to IR radiation and, if required, a peelable cover sheet, the layer (A) crosslinkable by actinic radiation being capable of being washed out by means of a developer after imagewise exposure and consisting essentially of a mixture of at least one elastomeric binder, ethylenically unsaturated copolymerizable organic compounds, a photoinitiator and, if required, further assistants, and the layer (B) sensitive to IR radiation being a layer which is soluble or dispersible in the developer and contains, in a film-forming binder having elastomeric character, at least one finely divided substance which has a high absorbance in the wavelength range from 750 to 20,000 nm.

1 Claim, No Drawings

MULTILAYER RECORDING ELEMENT SUITABLE FOR THE PRODUCTION OF FLEXOGRAPHIC PRINTING PLATES BY DIGITAL INFORMATION TRANSFER

The present invention relates to a multilayer recording element which is suitable for the production of flexographic printing plates by digital information transfer and has, arranged one on top of the other on a dimensionally stable substrate, a layer which may be bonded to the dimensionally stable substrate by an adhesion-promoting layer and is crosslinkable by actinic radiation, a layer which is sensitive to IR radiation and, if required, a peelable cover sheet.

Flexographic printing plates consist of a photosensitive photopolymerizable layer which is applied to a dimensionally stable substrate, such as a polyethylene terephthalate film or to an aluminum sheet. An adhesion-promoting layer may furthermore be applied between these layers in order to provide the laminate with a firm bond. Moreover, a release layer may be present on the photosensitive, photopolymerizable layer. This release layer is required whenever the photosensitive, photopolymerizable layer underneath is so tacky that, when the photographic negative is placed on top, the air present in the vacuum printing frame cannot be uniformly removed, which would then result in vacuum errors on exposure.

The information contained in the photographic negative is transferred to these photosensitive, photopolymerizable layers by placing a photographic negative on top, removing the air by means of the vacuum frame and carrying out uniform exposure. In the subsequent development step, the unphotopolymerized parts are removed by a suitable developer; the photopolymerizable image sections are insoluble and thus form the relief structure. The developer must be tailored to the photopolymerizable layer used and, if required, also to the release layer used. Depending on the type of binder, suitable developers are in general mixtures of perchloroethylene with alcohols, mixtures of hydrocarbons with alcohols, pure water or mixtures of water and components soluble therein, for example sodium carbonate, sodium hydroxide, citric acid, lactic acid, surfactants, etc. The development step is followed by a drying step to remove the developer from the swollen relief layer. Depending on the photosensitive material, the plate may require further processing steps. Thus, in the case of some printing plates, uniform postexposure is also required in order to cure the printing plate completely. Furthermore, the surfaces may be detackified by UVC aftertreatment, for example in the case of printing plates based on styrene/butadiene (isopropene) block copolymers.

In the process described here, the information is transferred via a photographic negative. According to the prior art, photographic negatives can be produced by exposing a photosensitive film by means of a plotter with subsequent development. Today, the information transferred to the film originates from a digitized data set. It is therefore desirable to produce a flexographic printing plate without the circuitous route via a photographic negative. In addition to shorter production times, the wet chemical processes during film development would no longer be required. Moreover, the geometrical dimensions of a photographic negative may vary owing to temperature and atmospheric humidity, which may lead to register problems in the finished flexographic plate since, when a corresponding photosensitive photopolymerizable layer is exposed, the information of the photographic negative is transferred as a 1:1 projection.

Digital processes in which no photographic negative is required have long been known.

For example, U.S. Pat. No. 4,555,471 describes a mask film which can be applied directly to a photopolymerizable plate. By means of laser exposure, the optical density of the film mask, which has a thermochromic system, can be influenced and the negative can be produced in this manner.

Furthermore, EP 0001138-A1 describes a process for the production of lithographic printing plates with formation of a fugitive negative.

DE 4117127 A1 describes a process in which an image mask is produced on photosensitive recording elements by using an inkjet printer or an electrophotographic printer. The disadvantage here is that the resolution is not sufficiently fine for the high-quality flexographic halftone printing.

WO 94/03839 describes a process in which a photosensitive recording element is structured by means of an IR laser and an image mask is produced in this manner. Here, the photosensitive recording element consists of a substrate, a photosensitive layer, a layer which is sensitive to IR light and opaque to actinic light, and a sheet. On exposure to the IR laser, the exposed parts of the layer sensitive to IR light are fixed to the sheet thereon and can be removed by peeling off the sheet. An image mask on the photosensitive recording layer is obtained in this manner. The disadvantage here is that damage, eg. scratches, in the film, which is also intended to provide mechanical protection, leads to defective information transfer.

U.S. Pat. No. 5,262,275 describes a process in which flexographic printing plates are provided with an image by a digital method, also by means of an IR laser. The recording element consists of a substrate, a photosensitive layer, a barrier layer and a layer which is sensitive to IR light and opaque to actinic light. The layer which is sensitive to IR light is written on directly by means of the IR laser, the material sensitive to IR light being evaporated in the parts recorded and these parts thus becoming transparent to actinic light. The barrier layer still present remains on the surface of the photopolymerizable layer.

This barrier layer is intended to prevent atmospheric oxygen from penetrating into the photopolymerizable layer during the photopolymerization and thus increasing the exposure time. Furthermore, the results of the exposure step should also be more easily reproducible in comparison with a recording element in which this barrier layer is absent.

It is an object of the present invention to provide a multilayer recording element which is suitable for the production of flexographic printing plates by digital information transfer, can be produced and processed in a simpler manner and is distinguished by a smaller increase in tonal value during printing.

We have found, surprisingly, that this object is achieved by the novel layer structure.

The present invention relates to multilayer recording elements which are suitable for the production of flexographic printing plates by digital information transfer and have, arranged one on top of the other on a dimensionally stable substrate, a layer (A) which may be bonded to the dimensionally stable substrate by an adhesion-promoting layer and is crosslinkable by actinic radiation, a layer (B) which is sensitive to IR radiation and, if required, a peelable cover sheet, wherein the layer (A) which is crosslinkable by actinic radiation can be washed out by means of a developer after imagewise exposure and essentially consists of a mixture of at least one elastomeric binder, ethylenically unsaturated copolymerizable organic compounds, a photoinitiator or photoinitiator system and, if required, further assistants, and the layer (B) which is sensitive to IR radiation is a layer which is soluble or dispersible in the developer and contains, in a film-forming binder having elastomeric character, at least one finely divided substance which has a high absorbance in the wavelength range from 750 to 20,000 nm, and the layer (B) has an optical density of ≧2.5 in the actinic range.

It is true of the advantageous possible embodiments of the novel recording elements that water or alcohol/water mixtures are suitable as developers both for the layer (A) and for the layer (B), or that an organic solvent or solvent mixture is suitable both for layer (A) and layer (B), or an organic solvent or solvent mixture is suitable as a developer for layer (A) and water or a water/alcohol mixture is suitable as a developer for layer (B).

The present invention furthermore relates to a process for the production of flexographic printing plates, wherein the layer (B) which is sensitive to IR radiation and is present in the multi-layer recording element is structured imagewise by means of an IR laser from a digital data set and a mask is thus produced on the layer (A) underneath, the layer (A) is then crosslinked by uniform exposure to actinic radiation in the subsequent printing parts, and thereafter the layer (B) is dispersed or dissolved in a developer and the uncrosslinked image sections of the layer (A) are developed in the same developer or in another developer.

The novel recording element is very useful for digital information transfer.

Suitable dimensionally stable substrates are the ones usually used for the production of flexographic printing plates.

Examples of suitable dimensionally stable substrates are plates, sheets and conical or cylindrical sleeves of metals, such as steel, aluminum, copper or nickel, or of plastics, such as polyethylene terephthalate, polybutylene terephthalate, polyamide and polycarbonate, woven fabrics and nonwovens, such as glass fiber fabrics, and composite materials comprising glass fibers and plastics.

Particularly suitable dimensionally stable substrates are dimensionally stable substrate sheets, for example polyethylene or polyester sheets, in particular polyethylene terephthalate sheets. These substrate sheets are in general from 50 to 500 μm, preferably from 75 to 400 μm, for example about 125 μm, thick.

These substrate sheets may be coated with a thin adhesion-promoting layer, for example a 1–5 μm thick layer, on that side of the substrate sheet which faces the photosensitive recording layer. This adhesion-promoting layer may consist, for example, of a mixture of a polycarbonate, a phenoxy resin and a polyfunctional isocyanate.

The layer (A) crosslinkable by actinic radiation is, according to the invention, a layer which consists essentially of a mixture of at least one elastomeric binder, one or more ethylenically unsaturated copolymerizable organic compounds, a photoinitiator or a photoinitiator system and, if required, further assistants and can be washed out by means of a developer after imagewise exposure.

Examples of suitable elastomeric binders are elastomeric polymeric binders, such as polyalkanedienes, vinylaromatic/alkadiene copolymers and block copolymers, alkadiene/acrylonitrile copolymers, ethylene/propylene copolymers, ethylene/propylene/alkadiene copolymers, ethylene/acrylic acid copolymers, alkadiene/acrylic acid copolymers, alkadiene/acrylate/acrylic acid copolymers and ethylene/(meth)acrylic acid/(meth)acrylate copolymers.

Very particularly suitable are elastomers which contain conjugated alkadienes, such as butadiene or isoprene, and styrene as polymerized units.

The elastomeric binder is present in the photopolymerizable layer (A) in an amount of from 5 to 95, preferably from 50 to 90, % by weight, based on the total amount of the components contained in (A).

Furthermore, the photopolymerizable relief-forming recording layer (A) to be used according to the invention contains conventional and known copolymerizable ethylenically unsaturated organic compounds which are compatible with the polymeric binders, in an amount of from 1 to 60, advantageously from 2 to 50, in particular from 3 to 40, % by weight, based on the total amount of (A). The term compatible indicates that the relevant monomers are so readily miscible with the elastomeric binder that no haze or streaks are caused in the relevant photopolymerizable relief-forming recording layer (A). Examples of suitable monomers are the conventional and known acrylates and methacrylates of monohydric or polyhydric alcohols, acrylamides and methacrylamides, vinyl ethers and vinyl esters, allyl ethers and allyl esters and diesters of fumaric or maleic acid, in particular the esters of acrylic and/or methacrylic acid with monohydric and, preferably, polyhydric alcohols, such as esters of acrylic or methacrylic acid with ethanediol, propanediol, butanediol, hexanediol or oxaalkanediols, such as diethylene glycol, or esters of acrylic or methacrylic acid with trihydric or polyhydric alcohols, such as glycerol, trimethylolpropane, pentaerythritol or sorbitol. Examples of particularly suitable mono- and polyfunctional acrylates or methacrylates are butyl acrylate, butyl methacrylate, 2-ethylhexyl acrylate, lauryl (meth)acrylate, hexanediol diacrylate, hexanediol dimethacrylate, ethylene glycol di(meth)acrylate, butane-1,4-diol di(meth)acrylate, neopentylglycol di(meth)-acrylate, 3-methylpentanediol di(meth)acrylate, 2-hydroxypropyl (meth)acrylate, 2-hydroxyethyl (meth)acrylate, 1,1,1-trimethylolpropane tri(meth)acrylate, di-, tri- and tetraethylene glycol di(meth)acrylate, tripropylene glycol di(meth)acrylate or pentaerythrityl tetra(meth)acrylate, and poly(ethylene oxide) di(meth)acrylate, ω-methylpoly(ethylene oxide)-α-yl (meth)acrylate, N,N-diethylaminoethyl acrylate, a reaction product of 1 mol of glycerol, 1 mol of epichlorohydrin and 3 mol of acrylic acid, and glycidyl methacrylate and bisphenol A diglycidyl ether acrylate.

Mixtures of photopolymerizable ethylenically unsaturated organic compounds and, for example, mixtures of monofunctional (meth)acrylates, eg. hydroxyethyl methacrylate, with polyfunctional (meth)acrylates of the abovementioned type are also suitable.

In addition to the (meth)acrylates, derivatives of (meth)acrylamides, for example N-methylol(meth)acrylamidoethers of polyols (eg. glycol), are also suitable.

In addition to an elastomeric binder and copolymerizable ethylenically unsaturated monomeric compounds, the layer (A) crosslinkable by actinic radiation (=photosensitive recording layer (A)) contains one or more photoinitiators, for example benzoin or benzoic derivatives, such as benzoin ethers of straight-chain or branched monoalcohols of 1 to 6 carbon atoms, eg. benzoin methyl ether, benzoin ethyl ether, benzoin isopropyl ether, benzoin n-butyl ether and benzoin isobutyl ether, symmetrically or asymmetrically substituted benzil acetals, such as benzil dimethyl acetal or benzil 1-methyl 1-ethyl acetal, diarylphosphine oxides, eg. 2,4,6-trimethylbenzoyldiphenylphosphine oxide or 2,6-dimethoxybenzoyldiphenylphosphine oxide or acyl-diarylphosphine oxides according to German Laid-Open Application DOS 2,909,992, or hydroxypropanones, such as 1-phenyl-2-methyl-2-hydroxy-1-propanone and 1-hydroxycyclohexyl phenyl ketone. They may be used alone or as a mixture with one another or in combination with coinitiators, eg. benzoin methyl ether with triphenylphosphine, diacylphosphine oxides with tertiary amines or acyldiarylphosphine oxides with benzil dimethyl acetal.

They are used in the mixtures in an amount of from 0.001 to 10, advantageously from 0.1 to 5, in particular from 0.3 to 2, % by weight, based on the total amount of the photosensitive recording layer (A), the presence of photopolymerizable monomers playing a role in determining the amount.

Further assistants which may be added—in general in an amount of from 0.001 to 2% by weight, based on the total amount of the photosensitive recording layer (A)—are thermal polymerization inhibitors which have no significant self-absorption in the actinic range in the photoinitiator absorbs, for example 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as Thionine Blue G (C.I. 52025), Methylene Blue B (C.I. 52015) or Toluidine Blue (C.I. 52040), or N-nitrosamines, such as N-nitrosodiphenylamine, or the salts, for example the potassium, calcium or aluminum salts, of N-nitrosocyclohexylhydroxylamine.

Suitable dyes, pigments or photochromic additives may also be added to the photosensitive mixture of the recording layer (A) in an amount of from 0.0001 to 2% by weight, based on the mixture. They serve for controlling the exposure properties, for identification, for direct monitoring of the exposure result or for esthetic purposes. A precondition for the choice and the amount of such additives is that they interfere with the photopolymerization of the mixtures to just as little an extent as the thermal polymerization inhibitors. For example, the soluble phenazinium, phenoxazinium, acridinium and phenothiazinium dyes, such as Neutral Red (C.I. 50040), Safranine T (C.I. 50240), Rhodanil Blue, the salt or amide of Rhodamine D (Basic Violet 10), Rhodanil Blue, the salt or amide of Rhodamine D (Basic Violet 10, C.I. 45170), Methylene Blue B (C.I. 52015), Thionine Blue G (C.I. 52025) or Acridine Orange (C.I. 46005), and also Solvent Black 3 (C.I. 26150) are suitable. These dyes may also be used together with a sufficient amount of a reducing agent which does not reduce the dye in the absence of actinic light but is capable of reducing the dye in the excited electronic state on exposure. Examples of such mild reducing agents are ascorbic acid, anethole, thiourea, eg. diethylallylthiourea, in particular N-allylthiourea, and hydroxylamine derivatives, in particular salts of N-nitrosocyclohexylhydroxylamine, preferably the potassium, calcium and aluminum salts. As stated, the latter may simultaneously serve as thermal polymerization inhibitors. The reducing agents may be added in general in amounts of from 0.005 to 5% by weight, based on the mixture, the addition of 3 to 10 times the amount of concomitantly used dye having proven useful in many cases. In addition, the formulations may also contain from 1 to 20, preferably from 3 to 10, % by weight of bases which partially or completely neutralize the acid functions of the ethylene/acrylic acid copolymer. Suitable bases are, for example, alkali metal hydroxides, alkali metal alcoholates and amines and alkanolamines. Particularly suitable bases are monoethanolamine, diethanolamine, butylethanolamine and triethanolamine.

The production of the photopolymerizable relief-forming recording layer (A) to be used according to the invention from its components is carried out in general by mixing the components by a known mixing method and by processing the mixture to give the recording layer (B) by a known method, such as casting in solution, calendering or extrusion, and these measures may also be combined with one another in a suitable manner.

The layer (A) crosslinkable by actinic radiation has in general a thickness of from 200 to 8000 μm, in particular 500 to 6000 μm. A further thin oxygen-permeable layer which may have a thickness of from 1 to 5 μm and detackifies the surface of the photosensitive recording layer (A) may be applied to said layer (A). The layer (B) which is sensitive to IR radiation is applied to the latter or, preferably, directly to the layer (A) crosslinkable by actinic radiation, said layer (B) being a layer which is soluble or dispersible in developers and contains, in a film-forming binder having elastomeric character, at least one finely divided substance which has a high absorbance in the wavelength range from 750 to 20,000 nm and an optical density of ≧2.5 in the actinic range. Developers may be water and water/alcohol or organic solvent (mixtures). Binders having elastomeric character which are suitable for the layer (B) are polymers, in particular copolymers, which are either water-soluble or dispersible in water or water/alcohol mixtures or those which are soluble or dispersible in organic solvents or solvent mixtures. Suitable alcohols in the water/alcohol mixtures are methanol, ethanol, n-propanol and isopropanol.

Examples of binders having elastomeric character and which are soluble or dispersible in water or in water/alcohol mixtures are polyvinyl alcohol/polyethylene glycol graft copolymers (eg. Mowiol® GE 597 from Hoechst), which are obtainable by grafting vinyl acetate onto polyethylene glycol having molecular weights of from 1000 to 50,000 and then carrying out hydrolysis to a degree of hydrolysis of from 80 to 100%.

Examples of binders having elastomeric character and which are soluble or dispersible in organic solvents or solvent mixtures are thermoplastic polyamide resins which can be prepared, for example, by conventional polycondensation and are marketed, for example, under the name Macromelt® by Henkel. All abovementioned products are described in detail in the respective relevant company publications.

The film-forming binders having elastomeric character of layer (B) contain, in finely divided form, substances which have a high absorbance in the IR range. Examples of such substances are various finely divided carbon black types, eg. carbon black FW 2000, special black 5, Printex®U from Degussa, having a mean primary particle size of 13–30 nm. Solutions which contain binders having elastomeric character and substances having high IR absorbance are advantageously used, said solutions either being applied uniformly directly to the layer (A) and dried or being cast on a film, dried and laminated with the layer (A). The film can, if required, be peeled off.

A peelable sheet transparent to actinic light, a cover sheet, which has a thickness of from 5 to 300 μm and consists, for example, of polyethylene or polyethylene terephthalate may also be applied to the layer (B).

The processing steps which comprise exposure to actinic light, development and drying are described in detail, for example, in the nyloflex® operating instructions (IIR 340705/1185) of BASF Aktiengesellschaft.

The layer (B) which is sensitive to IR radiation can be written on imagewise by means of an IR laser, preferably an Nd-YAG laser. This may advantageously be effected on a drum on which the plate is mounted. A layer (B) which is sensitive to IR light and consists of an elastomeric binder and IR absorbers dispersed therein proves advantageous here. Owing to the elastomeric character of this layer, the surface of the plate, which is stretched as a result of being mounted on the drum, is not damaged, as would be the case with a nonelastic material. After the digital information transfer, uniform exposure to actinic light is carried out. Either this may be effected on the drum of the IR laser or the plate is removed and the uniform exposure is carried out in a conventional flat-plate exposure unit (eg. FIII exposure unit from BASF). The recording element is then developed. Commercial continuous or rotary cylindrical washers may be used for this purpose, as available, for example, from BASF Aktiengesellschaft. Depending on the chemistry of the binder having elastomeric character which is used in layer (B), this layer must be removed, if necessary in a predeveloper, if this layer is not soluble or dispersible in the developer of layer (A). For example, the following developer combinations have proven advantageous, depending on the chemistry of the layer (B):

| Binder of layer (B): | Solubility of layer (A) | Developer for layer (B) |
|---|---|---|
| Polyvinyl alcohol/polyethylene glycol graft copolymer | Organic solvent or mixtures of organic solvents | Water or water/alcohol |
|  | Water or aqueous systems | Water or water/alcohol |
| Thermoplastic polyamide resin | Organic solvent or mixtures of organic solvents | Organic solvent or solvent mixtures (no predevelopment required) |

Organic solvent mixtures suitable as developers are, for example, perchloroethylene/butanol mixtures or Nylosoly® (hydrocarbon/alcohol mixture).

The predevelopment step can be carried out in a very simple manner, for example in commercial pad washers from BASF, which are very useful for this purpose.

After the development, the recording material is also subjected to a drying step. Here, the developer still contained in the relief layer is removed. Here too, all commercial driers, including, for example, those from BASF AG, are suitable.

During the uniform exposure to actinic light, the presence of atmospheric oxygen surprisingly proves to be extremely advantageous.

The photopolymerization is suppressed by the oxygen, which is known to act as a photopolymerization inhibitor, at the edges of the image parts, ie. subsequently the printing parts; in the middle of the image parts, the inhibitory effect is not so great since sufficient actinic light is available. Consequently, the diameter of each image section is substantially reduced. In other words, instead of 1:1 transfer from the mask produced by IR ablation, the result is the transfer of small areas. During printing, this has the major advantage that a much smaller increase in tonal value is achieved. This is very advantageous since, in the flexographic printing process, the printing plate is inked via an engraved roller and the ink is then transferred from the printing plate to the material being printed, said material being passed around a hard impression roller. The resilient flexographic printing plate is compressed, with the result that this squeezing process causes the printed area to be greater than the inked area on the printing plate. This is referred to as an increase in total value. If the photosensitive recording materials which are described in U.S. Pat. No. 5,262,275 and have a barrier between IR-sensitive layer and layer crosslinkable by actinic light are used, the inhibitory effect of the atmospheric oxygen is no longer so great; the increase in tonal value of a printing plate produced in this manner in the printing process is then also correspondingly larger.

The Examples illustrate the production of the novel photosensitive recording elements and the printed copies obtained with these recording elements. In the examples which follow, parts and percentages are by weight, unless stated otherwise.

Comparative Example 1

A photosensitive recording layer was produced according to Example 2 from U.S. Pat. No. 5,262,275. This photosensitive recording material was mounted on a vacuum drum and exposed to an Nd:YAG laser (wavelength 1064 nm). The spot diameter of the IR laser beam was adjusted to 10 μm. This is an exposure unit from Baasel-Scheel. The plate was then removed from the drum and was exposed uniformly in an FIII exposure unit (from BASF) for 15 minutes. Thereafter, the plate was developed in a BASF rotary cylindrical washer with a 3:1 mixture of perchloroethylene/butanol and then dried for 2 hours at 60° C. The print motif chosen had a screen width of 54 lines/cm and had a tonal range of 3–95%. This flexographic printing plate was then mounted on a commercial flexographic printing press, and polyethylene film was printed with alcohol inks. The printed copy with then visually assessed in comparison with Examples 1 and 2.

EXAMPLE 1

A water-soluble layer (B) sensitive to IR light was produced by dissolving 3 parts of carbon black (Printex U from Degussa) and 4 parts of a polyvinyl alcohol/polyethylene glycol graft copolymer (Mowiol GE 597 from Hoechst), which was obtained by grafting vinyl acetate onto polyethylene glycol with subsequent hydrolysis, in 80 parts of water and 10 parts of propanol. Propanol was used as a cosolvent in order to achieve good wetting when the solution was cast on a polyethylene terephthalate sheet. After combination of these components, the dispersion was treated for 2 hours in a disperser (Ultra-Turrax) in order to obtain a finely divided dispersion. The dispersion thus prepared was cast on a polyethylene terephthalate sheet (125 μm Mylar® from DuPont), this being done in such a way that the layer thickness after drying was 5 μm and the optical density of this layer was from 4 to 4.5.

This laminate was laminated in a conventional manner with a multilayer plate which contained a styrene/isoprene block copolymer as the elastomeric binder in the layer (A) and could be developed with organic solvents (eg. a Cyrel® 107 PLS+printing plate from DuPont), after the protective sheet and the release layer underneath (=barrier layer) had been removed from this plate by peeling them off.

After the protective sheet had been peeled off, this photosensitive recording material was mounted on a vacuum drum and exposed to an Nd:YAG laser (wavelength 1064 nm). The spot diameter of the IR laser beam was adjusted to 10 μm. This is an exposure unit from Baasel-Scheel. The plate was then removed from the drum and was exposed uniformly in an FIII exposure unit (from BASF) for 15 minutes. Thereafter, the plate was developed in a BASF rotary cylindrical washer with a 3:1 mixture of perchloroethylene/butanol and then dried for 2 hours at 60° C. The print motif chosen corresponded to that of Comparative Example 1. This flexographic printing plate was then mounted on a commercial flexographic printing press, and polyethylene film was printed with alcohol inks. The printed copy was then visually assessed. The direct comparison with Comparative Example 1 impressively and clearly showed that the increase in tonal value in Example 1 is very much smaller; the fine image sections give a much finer print. In general, the printed copy according to Example 1 is substantially better than that of Comparative Example 1 in all respects.

EXAMPLE 2

The layer sensitive to IR radiation was applied to a 125 μm-Mylar sheet as in Example 1. The photosensitive polymer layer was then extruded directly between the substrate sheet provided with a mixture of adhesive-forming components and the Mylar film provided with the layer (B) sensitive to IR light. The photopolymerizable material used (=layer (A)) consists of 80 parts of Cariflex TR 1107 (styrene/isoprene/styrene block copolymer containing 15% of styrene, from Shell) as an elastomeric binder, 10 parts of hexanediol diacrylate as crosslinking agent, 1 part of benzil dimethyl ketal as a photoinitiator, 1 part of 2,6-di-tert-butyl-p-cresol as a stabilizer, 1 part of a microcrystalline wax (Antilux A 550 from Rheinchemie) as an antiozonant and 8 parts of white oil. The extrusion process is described in detail in DE-A-3147325 (EP 80665).

After the protective sheet had been peeled off, this photosensitive recording material was mounted on a vacuum drum and exposed to an Nd:YAG laser (wavelength 1064 nm). The spot diameter of the IR laser beam was adjusted to 10 μm. An exposure unit from Baasel-Scheel was used for this purpose. Thereafter, the plate was removed from the drum and was exposed uniformly in an FIII exposure unit (from BASF) for 15 minutes. The plate was then developed in a BASF rotary cylindrical washer with a 3:1 mixture of perchloroethylene/butanol and was then dried for 2 hours at 60° C. The print motif chosen corresponded to that of Comparative Example 1. Thereafter, this flexographic printing plate was mounted on a commercial flexographic printing press, and polyethylene film was printed with alcoholic inks. The printed copy was then visually assessed. The direct comparison with Comparative Example 1 and Example 1 clearly showed that the increase in tonal value is comparable with that of Example 1; the fine image sections give a very fine print. In general, the printed copy according to Example 2 is also substantially better than that of Comparative Example 1 in all respects.

We claim:

1. A process for the production of flexographic printing plates using a multilayer recording element consisting essentially of arranged one on top of the other on a dimensionally stable substrate, (1) optionally, an adhesion promoting layer,
(2) a layer (A) which is crosslinkable by actinic radiation,
(3) a layer (B) which is sensitive to IR, and
(4) optionally, a peelable cover sheet,
wherein the layer (a) can be washed out by means of a developer after imagewise exposure and essentially consists of a mixture of
(A1) at least one elastomeric binder,
(A2) ethylenically unsaturated copolymerizable organic compounds,
(A3) a photoinitiator or photoinitiator system, and
(A4) optionally further assistants,
and wherein the layer (B) is soluble or dispersible in the developer or in a different predeveloper and contains an elastomeric film-forming binder, at least one finely divided substance which has a high absorbance in the wavelength range from 750 to 20000 nm, the layer (b) has all optical density of ≧w, 5 in the actinic range, and
wherein the recording element contains no oxygen-impermeable barrier layer between layers (A) and (B), performing the following steps:

(i) optionally, removing a cover sheet,
(ii) structuring imagewise layer (B) by means of an IR-laser from a digital data set, thus producing a mask by IR-ablation on the layer (A) underneath,
(iii) exposing the recording element to actinic radiation, in the presence of atmospheric oxygen, thus crosslinking layer (A) in those parts which are not covered by the mask,
(iv) removing layer (B) with water or an alcohol/water mixture,
(v) removing the uncrosslinked parts of layer (A) with an organic solvent or organic solvent mixture.

* * * * *

UNITED STATES PATENT AND TRADEMARK OFFICE
CERTIFICATE OF CORRECTION

PATENT NO.: 6,037,102

DATED: March 14, 2000

INVENTOR(S): LOERZER et al.

It is certified that error appears in the above-identified patent and that said Letters Patent is hereby corrected as shown below:

On the title page, item [73]:

Please correct the assignee information.

The Assignee should read "BASF Lacke +Farben Aktiengesellschaft, Muenster, Germany", not "BASF Lacke +Farber Aktiengesellschaft, Muenster, Germany IN THE CLAIMS
Column 10, claim 1, line 25, change "all"

Signed and Sealed this

Twenty-seventh Day of March, 2001

*Attest:*

NICHOLAS P. GODICI

*Attesting Officer*   Acting Director of the United States Patent and Trademark Office